US006569744B2

(12) United States Patent
Wylie

(10) Patent No.: US 6,569,744 B2
(45) Date of Patent: May 27, 2003

(54) METHOD OF CONVERTING A METAL OXIDE SEMICONDUCTOR TRANSISTOR INTO A BIPOLAR TRANSISTOR

(75) Inventor: Ian Wylie, Greenwich, NJ (US)

(73) Assignee: Agere Systems Inc., Allentown, PA (US)

( * ) Notice: Subject to any disclaimer, the term of this patent is extended or adjusted under 35 U.S.C. 154(b) by 13 days.

(21) Appl. No.: 09/882,623

(22) Filed: Jun. 15, 2001

(65) Prior Publication Data

US 2002/0192917 A1 Dec. 19, 2002

(51) Int. Cl.[7] ............................................. H01L 21/331
(52) U.S. Cl. ..................... 438/321; 438/320; 438/360; 257/577; 257/592
(58) Field of Search ................................ 438/362, 309, 438/320, 321; 257/577, 586, 592

(56) References Cited

U.S. PATENT DOCUMENTS

| 5,320,972 | A | | 6/1994 | Wylie |
| 5,428,243 | A | | 6/1995 | Wylie |
| 5,648,279 | A | * | 7/1997 | Imai .................... 148/DIG. 10 |
| 5,904,536 | A | * | 5/1999 | Blair ................... 148/DIG. 10 |
| 6,156,594 | A | * | 12/2000 | Gris ........................... 438/202 |
| 6,344,384 | B2 | * | 2/2002 | Arai et al. .................. 438/234 |
| 6,399,993 | B1 | * | 6/2002 | Ohnishi et al. ............. 257/370 |

* cited by examiner

Primary Examiner—Trung Dang

(57) ABSTRACT

The present invention provides a method of manufacturing a bipolar transistor. The method includes producing an opening in a dielectric layer located over a substrate and forming a collector in the substrate by implanting a first dopant through the opening. The method further includes creating an intrinsic base region contacting the collector and constructing an emitter contacting the intrinsic base region, both of which are through the opening.

23 Claims, 13 Drawing Sheets

METHOD OF CONVERTING A METAL OXIDE SEMICONDUCTOR TRANSISTOR INTO A BIPOLAR TRANSISTOR

TECHNICAL FIELD OF THE INVENTION

The present invention is directed, in general, to a method of manufacturing a bipolar transistor and, more specifically, to a method of converting a metal oxide semiconductor (MOS) transistor into a bipolar transistor.

BACKGROUND OF THE INVENTION

The advent of the integrated circuit has had a significant impact on various types of communication devices. The integrated circuit has been incorporated into both radio frequency applications and high speed communication network systems. While operating speeds of these communication devices have dramatically increased, the demand for yet faster communication devices continues to rise.

Bipolar devices have been used throughout the years for applications requiring high speed/high current drive, as well as low noise. Bipolar devices are especially desirable because they may be used in conjunction with traditional metal oxide semiconductor (MOS) technologies, providing an integrated circuit that yields the desired high speed/high current capabilities, as well as the equally desired lower speed/lower current capabilities. However, while bipolar devices are currently able to provide the high speed/high current capabilities presently desired, bipolar devices experience certain drawbacks that limit their use.

One such drawback is the high cost of manufacturing bipolar devices. Because of the techniques required to manufacture bipolar devices, bipolar devices are much more expensive to manufacture than traditional MOS devices. In many instances it may require an additional 6 to 8 masking steps to manufacture a bipolar device, as compared to a traditional MOS device. While lithography has been improved over the years, becoming less time consuming and expensive, it still comprises a substantial portion of the manufacturing expenses associated with producing integrated circuit devices.

Accordingly, what is needed in the art is a bipolar transistor and a method of manufacture therefor, which provides the high speed/high current characteristics generally desired, however, that is much easier and less expensive to manufacture than the prior art bipolar devices.

SUMMARY OF THE INVENTION

To address the above-discussed deficiencies of the prior art, the present invention provides a method of manufacturing a bipolar transistor. The method includes producing an opening in a dielectric layer located over a substrate, and forming a collector in the substrate by implanting a first dopant through the opening. The method further includes creating an intrinsic base region contacting the collector, and constructing an emitter contacting the intrinsic base region, both of which are achieved through the opening.

The present invention is further directed to a method of manufacturing an integrated circuit, including fabricating more than one of the previously described bipolar transistors, and connecting the bipolar transistors to form an operative integrated circuit. In another aspect, the present invention provides a bipolar transistor. The bipolar transistor includes (1) a collector located in a substrate, (2) an intrinsic base region located in the collector, (3) source/drain regions contacting the intrinsic base region and located outside of the collector, and (4) an emitter located on the substrate over the intrinsic base region.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
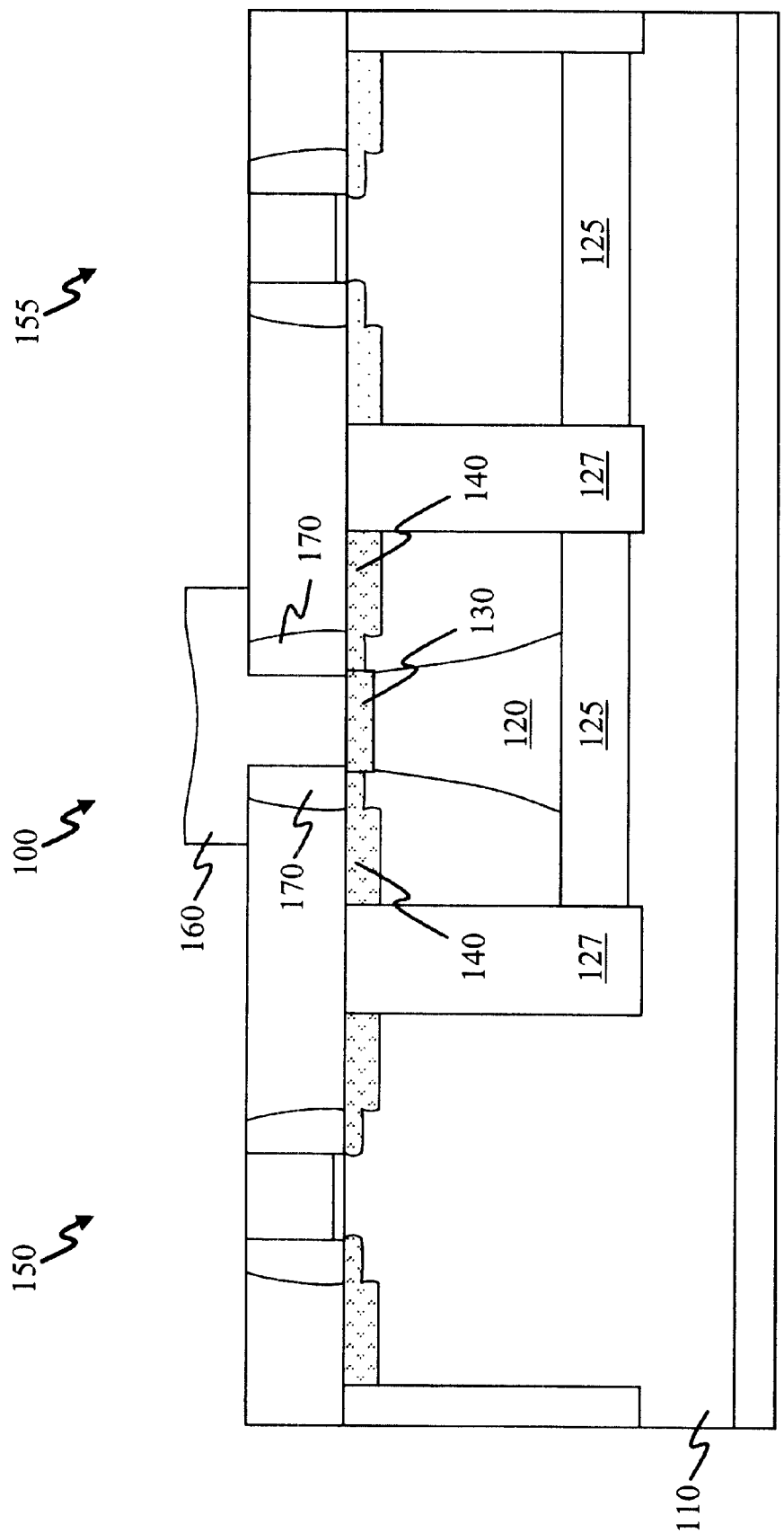
FIG. 1 illustrates one embodiment of a bipolar transistor constructed in accordance with the principles of the present invention.

Referring initially to FIG. 1, illustrated is one embodiment of a bipolar transistor, generally designated 100, constructed in accordance with the principles of the present invention. In the embodiment illustrated in FIG. 1, the bipolar transistor 100 includes a semiconductor substrate 110. The semiconductor substrate 110 may be any layer located in an integrated circuit, including a layer located at the wafer level or a layer located above or below wafer level. Located within the semiconductor substrate 110 is a collector 120. The collector 120, in an exemplary embodiment, is doped with a first dopant, and preferably to a dopant concentration ranging from about 1E16 atoms/cm$^3$ to about 1E17 atoms/cm$^3$. As shown in the illustrative embodiment of FIG. 1, a buried layer 125 with typical dopant concentration of about 1E19 to 1E20 atoms/cm3, and trench isolations 127, may bound the collector 120 providing isolation therefor. The buried layer 125 also provides a retrograde well for similarly doped MOS transistors, which improves their immunity to latch-up effects.

Also illustrated in FIG. 1, and within the collector 120, is an intrinsic base region 130. The intrinsic base region 130, in this particular embodiment, is doped with a second dopant. In an exemplary embodiment, the intrinsic base region 130 is doped with the second dopant to a dopant concentration ranging from about 1E19 atoms/cm$^3$ to about 1E20 atoms/cm$^3$. Contacting the intrinsic base region 130 but located outside the collector 120, are source/drain regions 140. In an exemplary embodiment, the source/drain regions 140 are formed by the same steps used to form source/drain regions of adjacent metal oxide semiconductor (MOS) transistors. In the illustrative embodiment, the previously formed MOS transistor, may be similar to MOS transistors 150, 155, located adjacent the bipolar transistor 100. In an exemplary embodiment, the source/drain regions 140 function as extrinsic contact regions for the intrinsic base region 130. It should be also noted that the source/drain regions 140 and the intrinsic base region 130 may be junction isolated from the collector region 120. Furthermore, at least one of the source/drain regions 140 will be used as an intrinsic base region contact (not shown herein).

Also located within the bipolar transistor 100, is an emitter 160 located on the substrate 110 and over the intrinsic base region 130. The emitter 160, in an exemplary embodiment, may be located between two gate sidewall spacers 170. In the illustrative embodiment shown in FIG. 1, the emitter 160 includes the first dopant, and preferably has a first dopant concentration ranging from about 1E20 atoms/cm$^3$ to about 1E21 atoms/cm$^3$.

As illustrated, the bipolar transistor 110 comprises an NPN bipolar transistor, wherein the first dopant is an N-type dopant and the second dopant is a P-type dopant. One skilled in the art understands, however, that the dopant types could be reversed, to provide a PNP bipolar transistor. Additionally, while the bipolar transistor 100 has been illustrated with MOS transistors 150, 155, located on adjacent sides thereof, and thus forming a BiCMOS device, one skilled in the art understands that this is not always the case, and that the bipolar transistor 100 could be formed alone, or with other bipolar transistors formed adjacent thereto.

Figure 2:
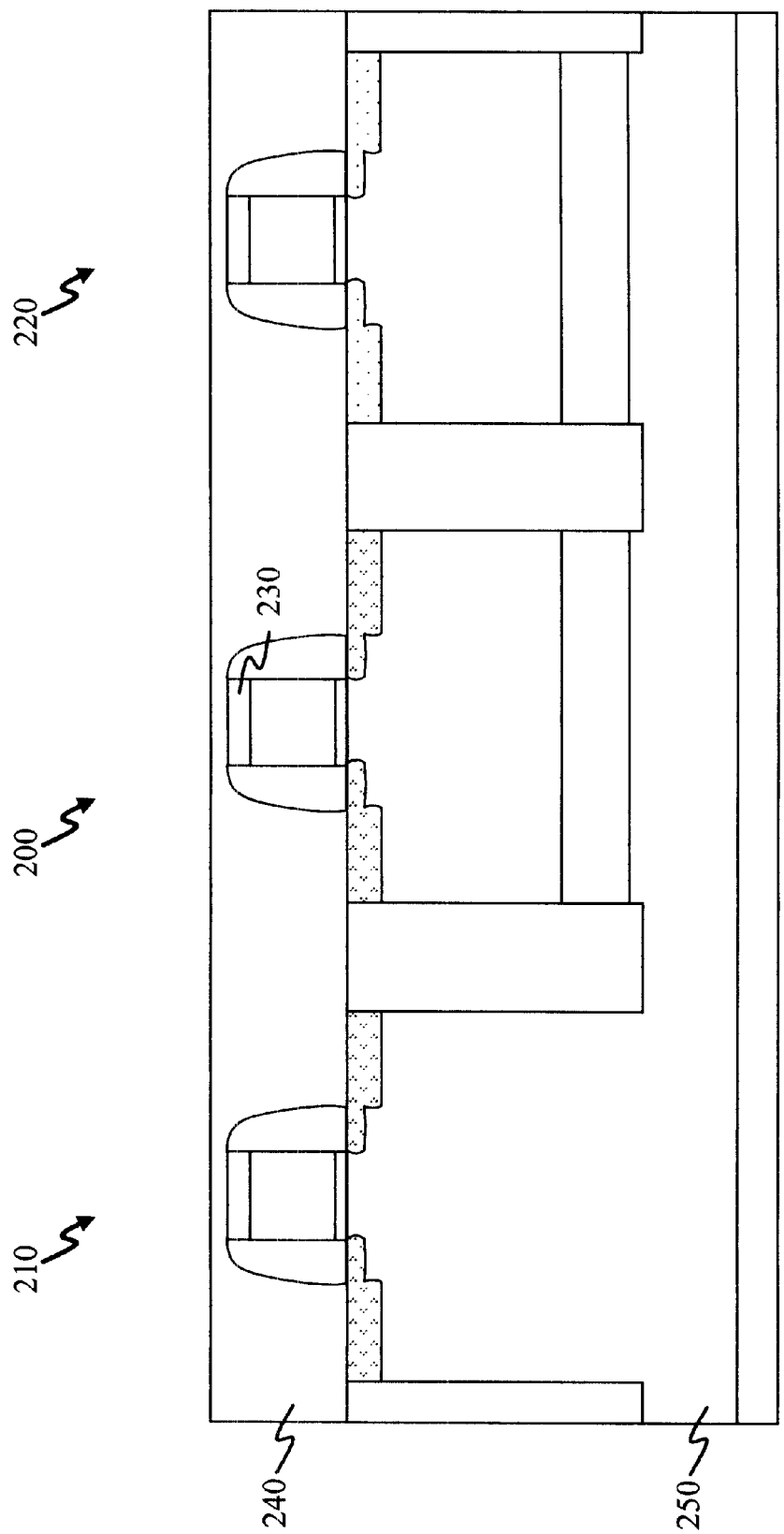
FIG. 2 illustrates a partially completed bipolar transistor, which in a prior step was a MOS transistor.

Turning now to FIGS. 2–11, shown are detailed steps illustrating how a bipolar transistor, similar to the bipolar transistor 100 illustrated in FIG. 1, might be manufactured. Illustrated in FIG. 2, is a partially completed bipolar transistor 200, which in this step is a conventionally formed MOS transistor with an additional etch stop layer formed thereover. Located adjacent to the partially completed transistor 200, in the illustrative embodiments shown in FIGS. 2–11, are additional conventionally formed MOS transistors 210, 220. It should be noted that, in an advantageous embodiment, the partially completed bipolar transistor 200 and the MOS transistors 210, 220 can be formed simultaneously with the same processing steps inasmuch as, at this particular step of manufacture, their structures are substantially similar. As previously mentioned, the number of the bipolar transistor 200 and the additional MOS transistors 210, 220 may vary.

The partially completed bipolar transistor 200 and MOS transistor 220 each include source/drain regions 205, 225, respectively. In an exemplary embodiment, depicted in a previous step not shown, the source/drain regions 205, 225 were simultaneously formed. As such, the source/drain regions 205, 225 have substantially the same dopant type, concentration and depth. For example, the source/drain regions 205, 225 could, in an exemplary embodiment, be formed to include an N-type dopant having a concentration ranging from about 1E19 atoms/cm$^3$ to about 1E20 atoms/cm$^3$. Additionally, the source/drain regions 205, 225 could be formed to a depth less than about 300 nm.

Located over the partially completed bipolar transistor 200, the MOS transistors 210, 220, and the nitride caps 230, is a dielectric layer 240. The dielectric layer 240 may be any known or hereafter discovered dielectric layer. The dielectric layer 240 may not, however, be a photoresist layer. This is because a photoresist layer, as understood in the art, is not a dielectric layer. In an exemplary embodiment, the dielectric layer 240 may include materials such as silicon dioxide, silicon nitride, tantalum pentoxide, or other similar materials.

The nitride caps 230 are a optional process innovation to facilitate the planarization of the dielectric layer 240, which may typically be accomplished using chemical mechanical polishing (CMP). As illustrated, the partially completed bipolar transistor 200 and the MOS transistors 210, 220, are located over a semiconductor substrate 250.

Figure 3:
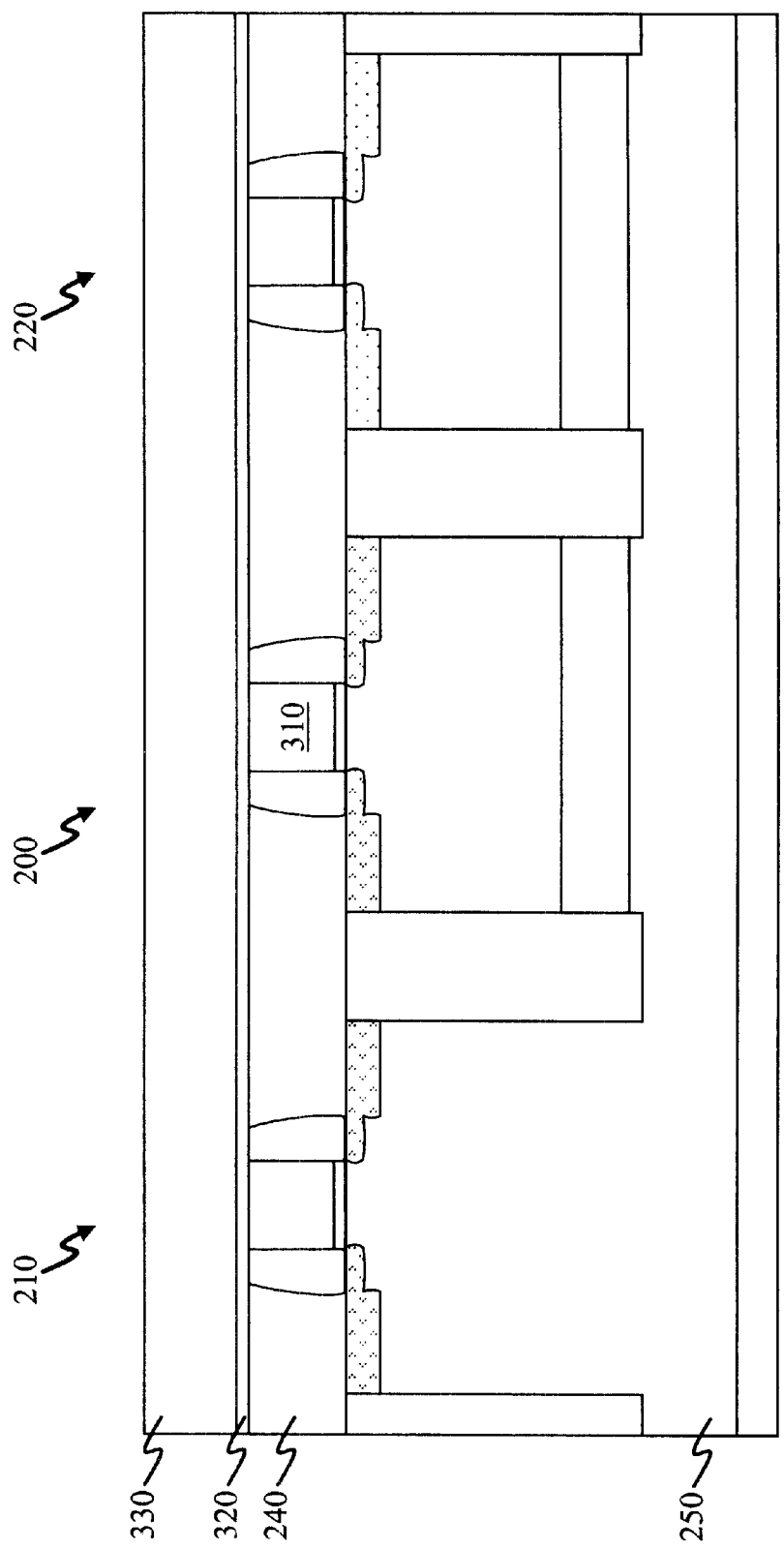
FIG. 3 illustrates the partially completed bipolar transistor illustrated in FIG. 2, after a blanket nitride etchback to remove nitride caps.

Turning now to FIG. 3, illustrated is the partially completed bipolar transistor 200 illustrated in FIG. 2, after a blanket nitride etchback to remove the nitride caps 230. It is desired for the blanket nitride etchback to stop on a gate electrode 310. Nitride etching is well known in the art, thus, one skilled in the art understands how to prevent the blanket nitride etchback from removing any significant amount of the gate electrode 310.

Subsequent to the blanket nitride etchback, a thin etch stop layer 320 is formed on the surface of the partially completed bipolar transistor 200 and MOS transistors 210, 220. In an exemplary embodiment, the thin etch stop layer 320 preferably comprises an oxide and has a thickness sufficient to protect the adjacent MOS transistors 210, 220, from subsequent processing steps. In one particular embodiment, the thickness of the thin etch stop layer 320 ranges from about 10 nm to about 100 nm, and more preferably, from about 20 nm to about 30 nm. After the thin etch stop layer 320 has been formed, a photoresist layer 330 is formed thereover. Conventional methods may be used to form the photoresist layer 330.

Figure 4:
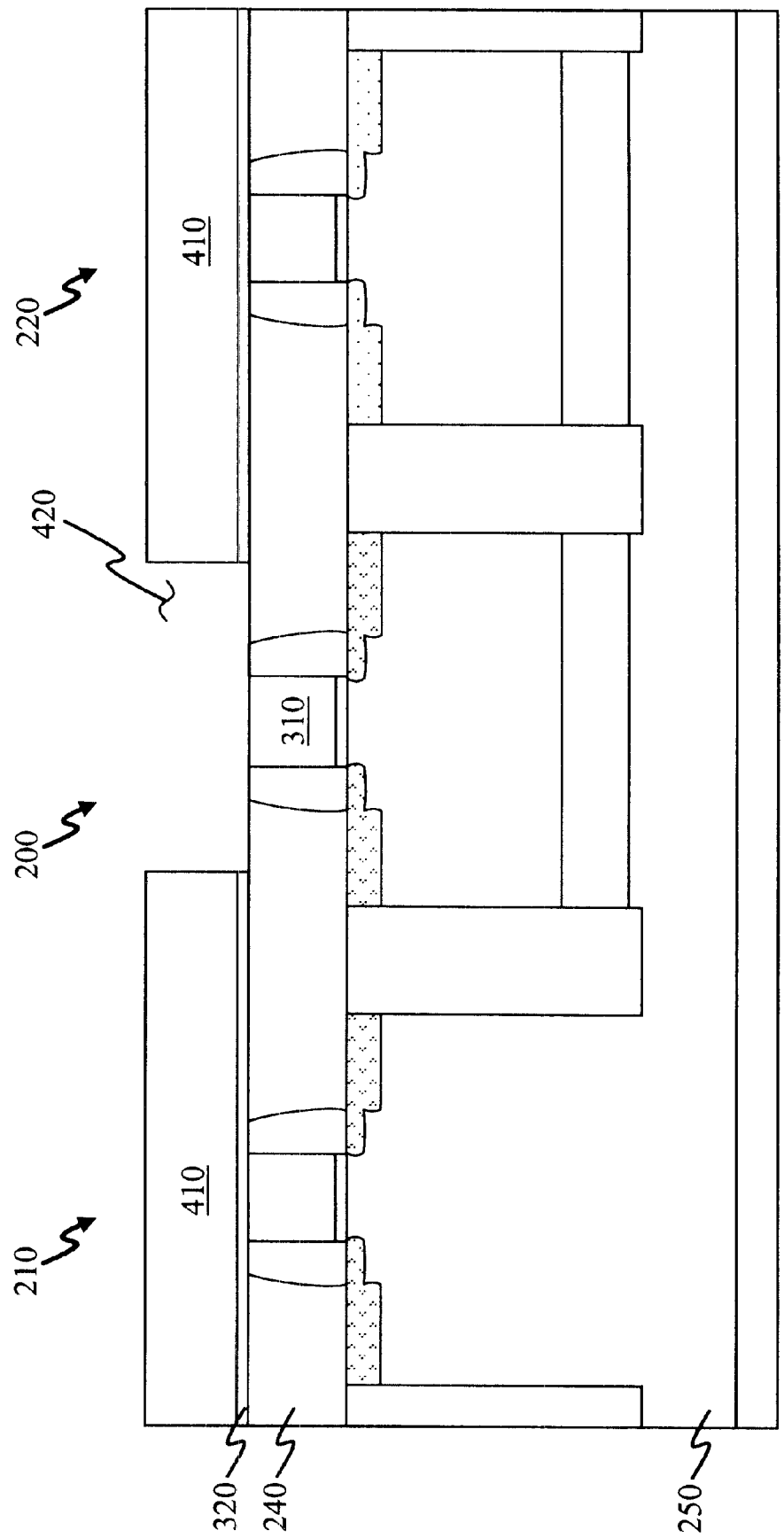
FIG. 4 illustrates the partially completed bipolar transistor illustrated in FIG. 3, after forming a photolithographic mask having an opening therein.

Turning now to FIG. 4, illustrated is the partially completed bipolar transistor 200 illustrated in FIG. 3, after patterning and developing the photoresist layer 330, thus forming a photolithographic mask 410 having an opening 420 therein. In the illustrative embodiment shown in FIG. 4, the photolithographic mask 410 is a non-critical photolithographic mask. For example, the location of the opening 420 is not critical, as long as it is located over the gate electrode 310 and as long as the dielectric layer 240 is thick enough to protect the underlying regions outside the gate electrode 310 from subsequent processing steps. After formation of the photolithographic mask 410, the thin etch stop layer 320 exposed by the opening 420, is conventionally removed.

Figure 5:
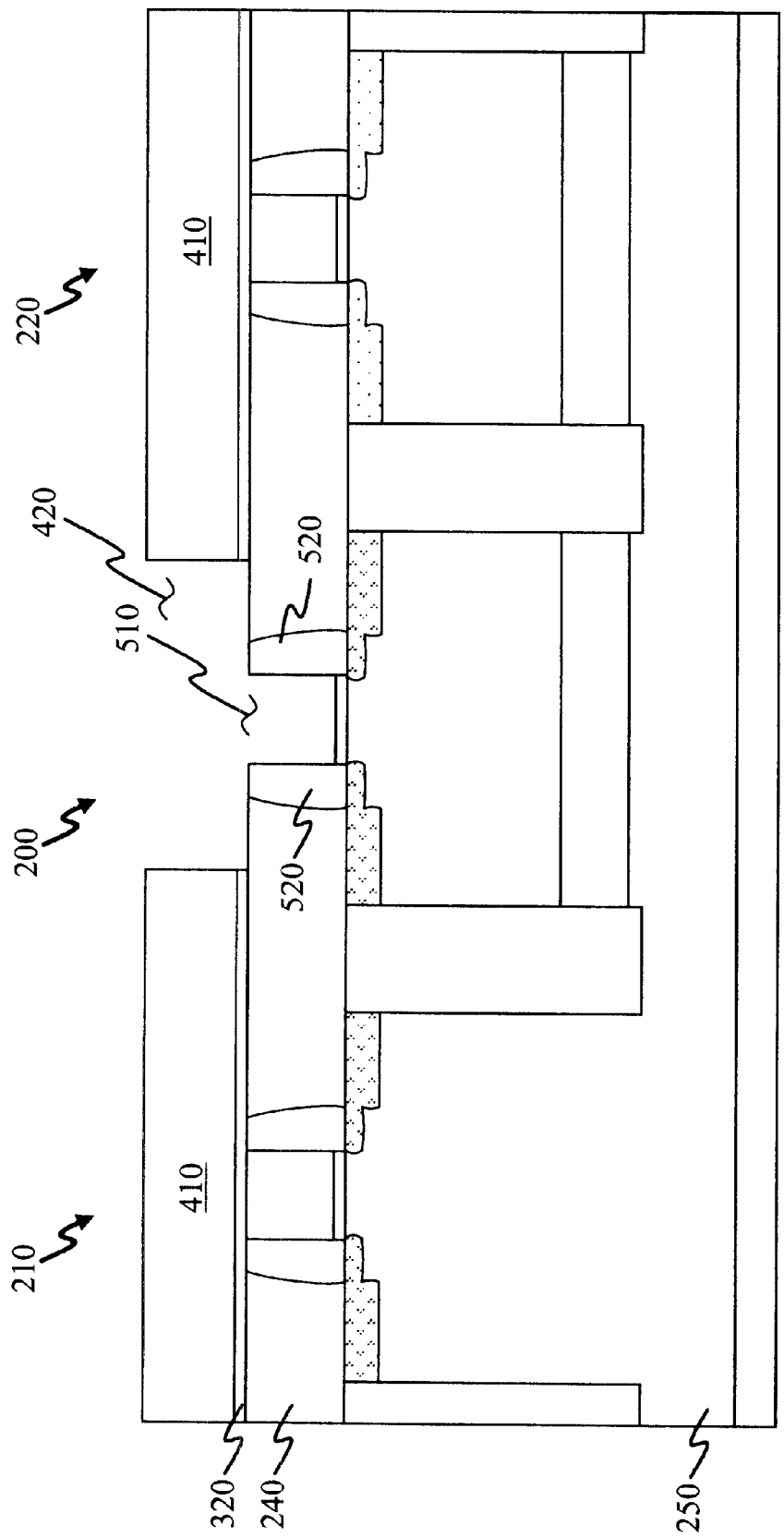
FIG. 5 illustrates the partially completed bipolar transistor illustrated in FIG. 4, after removal of a gate electrode.

Turning now to FIG. 5, illustrated is the partially completed bipolar transistor 200 illustrated in FIG. 4, after removal of the gate electrode 310. The gate electrode 310 may be removed using any known or hereafter discovered process. However, in one exemplary embodiment, the gate electrode 310 is removed using an etching process, which for a gate electrode made of polysilicon would be a well known prior art process. What results, is an opening 510 formed in the dielectric layer 240 located over the substrate 250. Sidewall spacers 520, which are remnants of the previously formed MOS transistor, may be optionally left in the opening, and in an advantageous embodiment, they are not removed.

Figure 6:
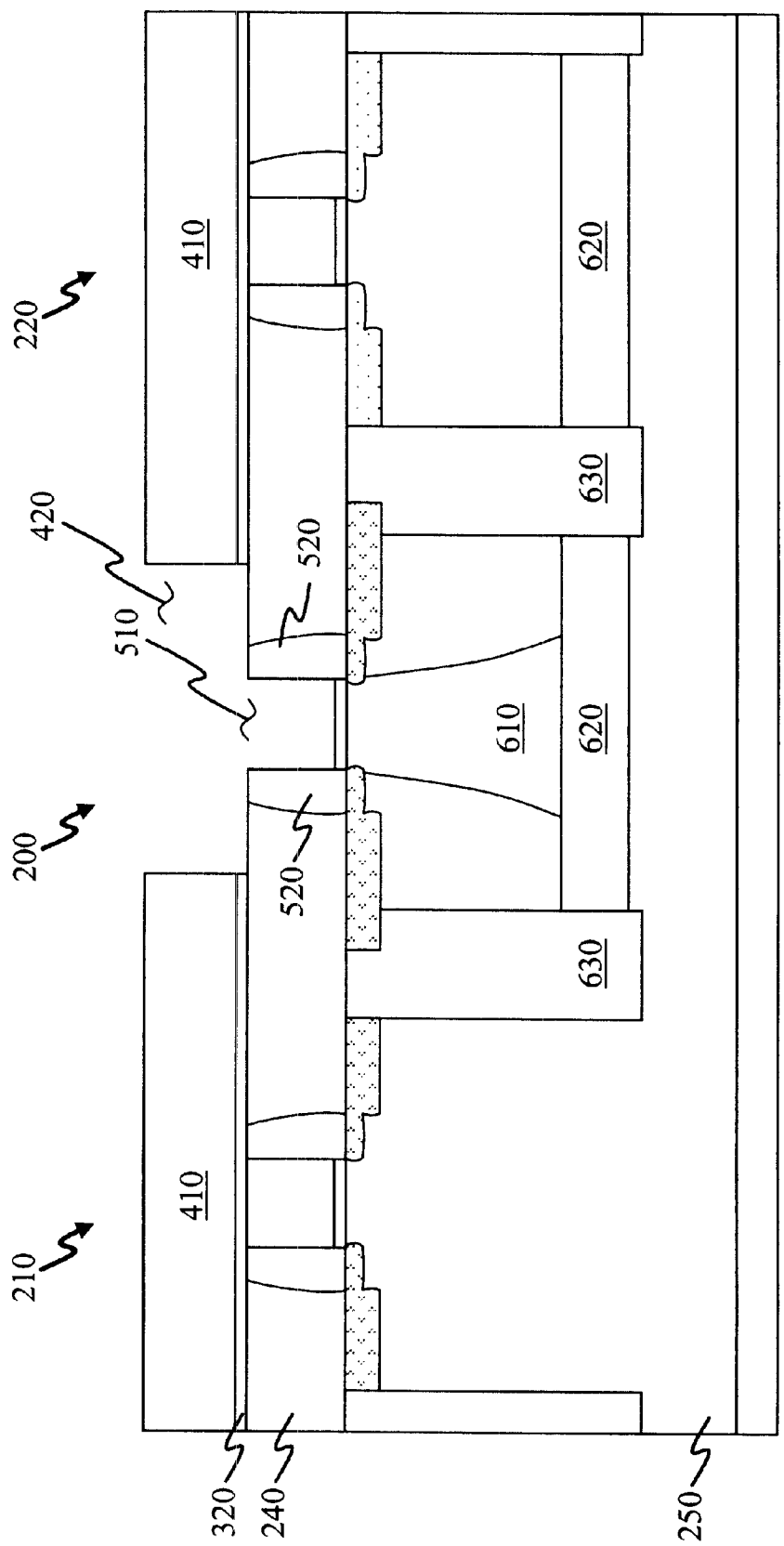
FIG. 6 illustrates the formation of a collector in the semiconductor substrate.

Turning now to FIG. 6, illustrated is the formation of a collector 610 in the semiconductor substrate 250. The collector 610 is formed by implanting a first dopant through the opening 510, and into the substrate 250. It should be understood that the types of dopants used to form the collector 610, and the base and emitter, which are discussed below, are well known to those skilled in the pertinent art. Additionally, one who is skilled in this art is also familiar with the dopant profiles required to form either a PNP, NPN or other dopant profile for a bipolar transistor. In the particular embodiment shown in FIG. 6, the collector 610 is doped with the first dopant to a concentration ranging from about 1E16 atoms/cm$^3$ to about 1E17 atoms/cm$^3$; however, one skilled in the art understands that other concentrations are within the scope of the present invention. As illustrated, the collector 610 may be bound on one side by a buried layer 620 and on its other sides by isolation trenches 630. The thin gate dielectric 720, which is a remnant of the MOS gate formation process, may be left in place at this point, as the high energy implant typically used for local collectors will easily pass through typical MOS gate dielectric layers.

Figure 7A:
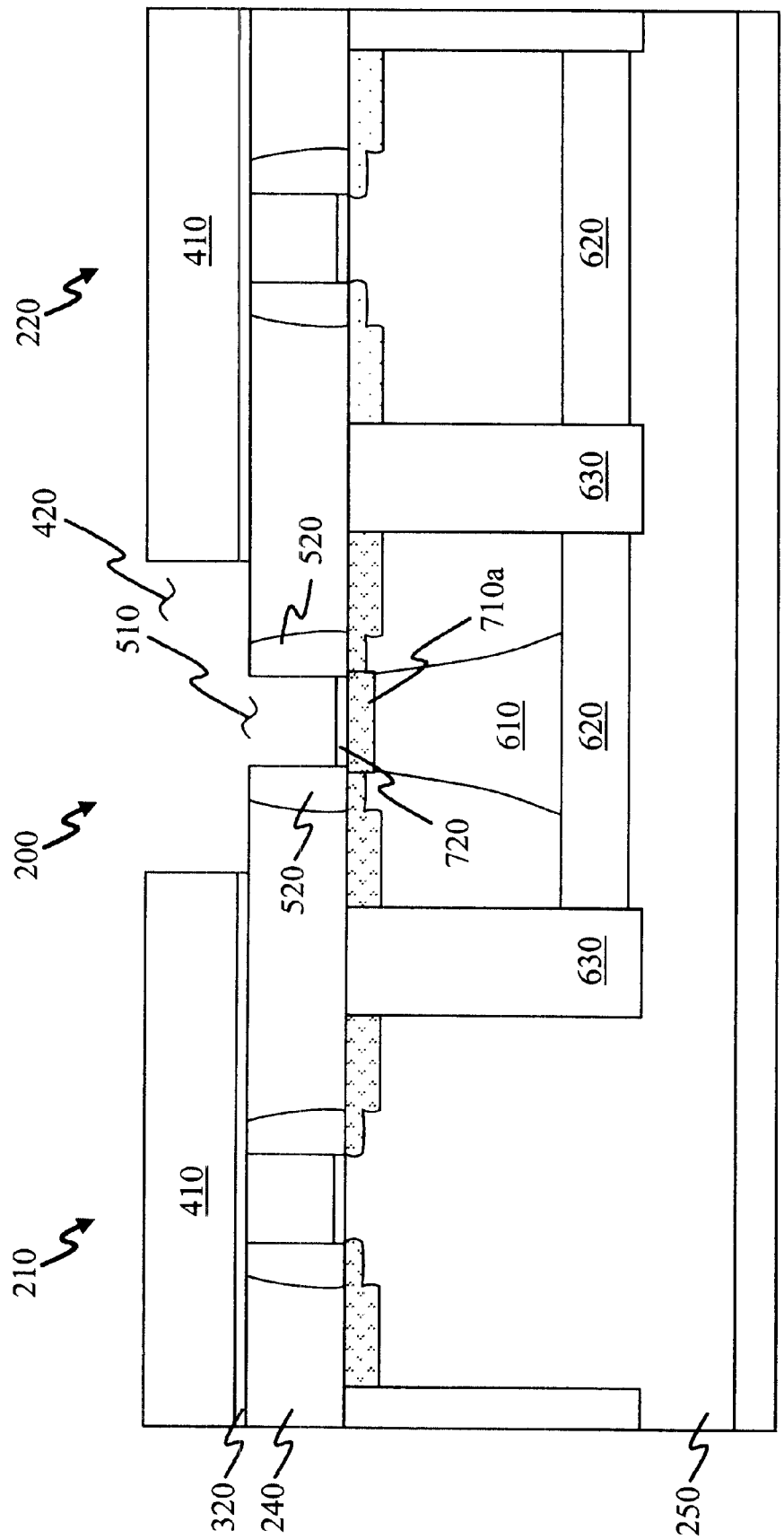
FIG. 7A illustrates the partially completed bipolar transistor illustrated in FIG. 6, after formation of an intrinsic base region within the opening, and contacting the collector.

Turning now to FIG. 7A, illustrated is the partially completed bipolar transistor 200 illustrated in FIG. 6, after formation of a intrinsic base region 710a within the opening 510, and contacting the collector 610. In this particular embodiment, the intrinsic base region 710a is formed by implanting a second dopant through the opening 510 and into the collector 610. In such an embodiment, the second dopant may have a concentration ranging from about 1E19 atoms/cm$^3$ to about 1E20 atoms/cm$^3$, however, various other concentrations may be used. In the illustrative embodiment shown in FIG. 7A, the intrinsic base region can be doped through the gate oxide 720, however, in another embodiment, the gate oxide 720 may be removed prior to forming the intrinsic base region 710a.

Figure 7B:
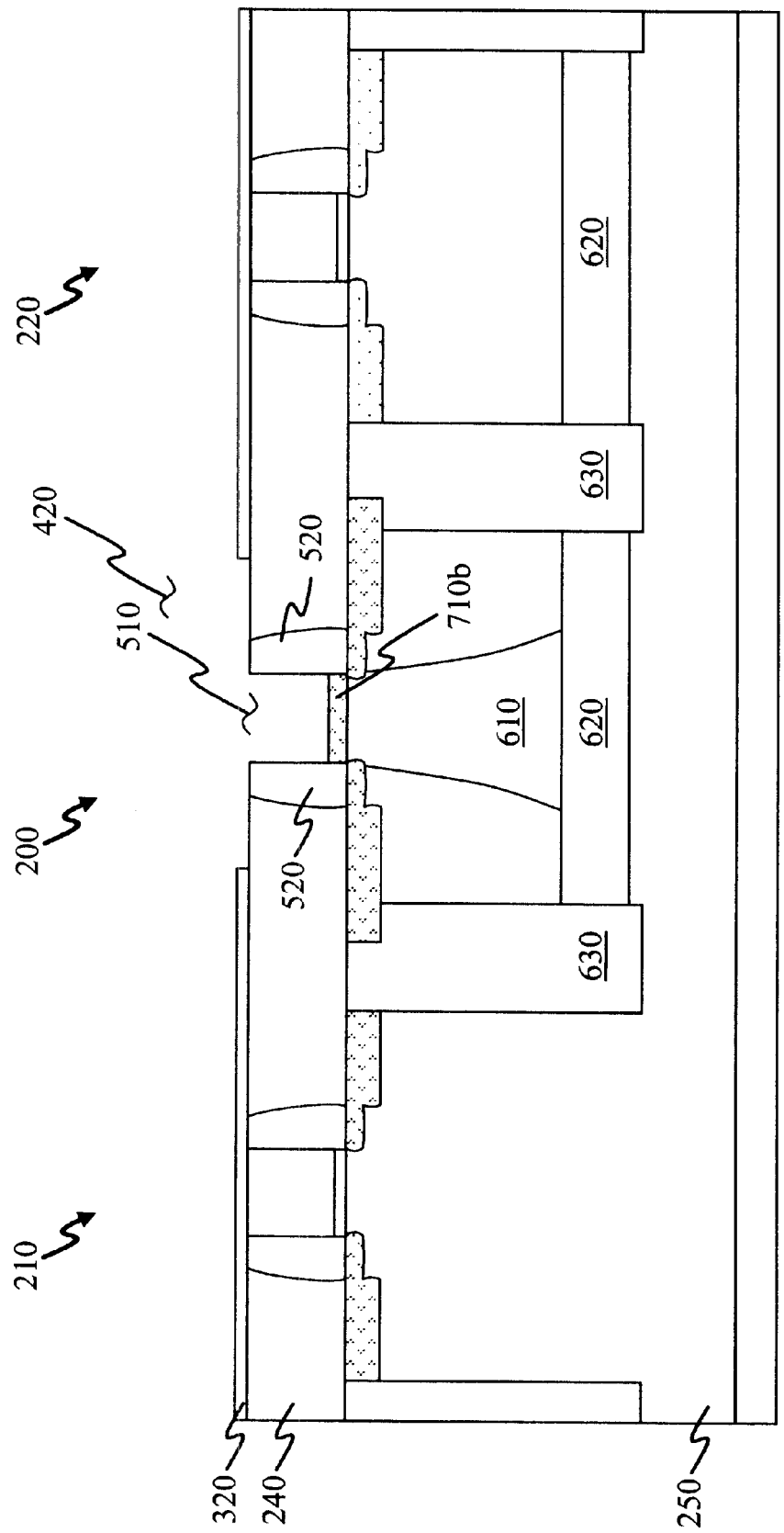
FIG. 7B illustrates an alternative embodiment of the partially completed bipolar transistor formed in FIG. 7A.

Turning now to FIG. 7B, illustrated is an alternative embodiment of the partially completed bipolar transistor 200 illustrated in FIG. 7A. The intrinsic base region 710b, illustrated in FIG. 7B, has been formed by growing a base material on the collector 610, and within the opening 510. In one advantageous embodiment, the intrinsic base region 710b comprises an epitaxially grown silicon germanium material, and has a thickness ranging from about 50 nm to about 1500 nm. In this particular embodiment, the gate oxide layer 720 (FIG. 7A) should be conventionally removed from the opening 510, prior to growth of the intrinsic base region 710b. Additionally, the exposed surface of the substrate 250 may be cleaned prior to growing the intrinsic base region 710b.

Figure 8:
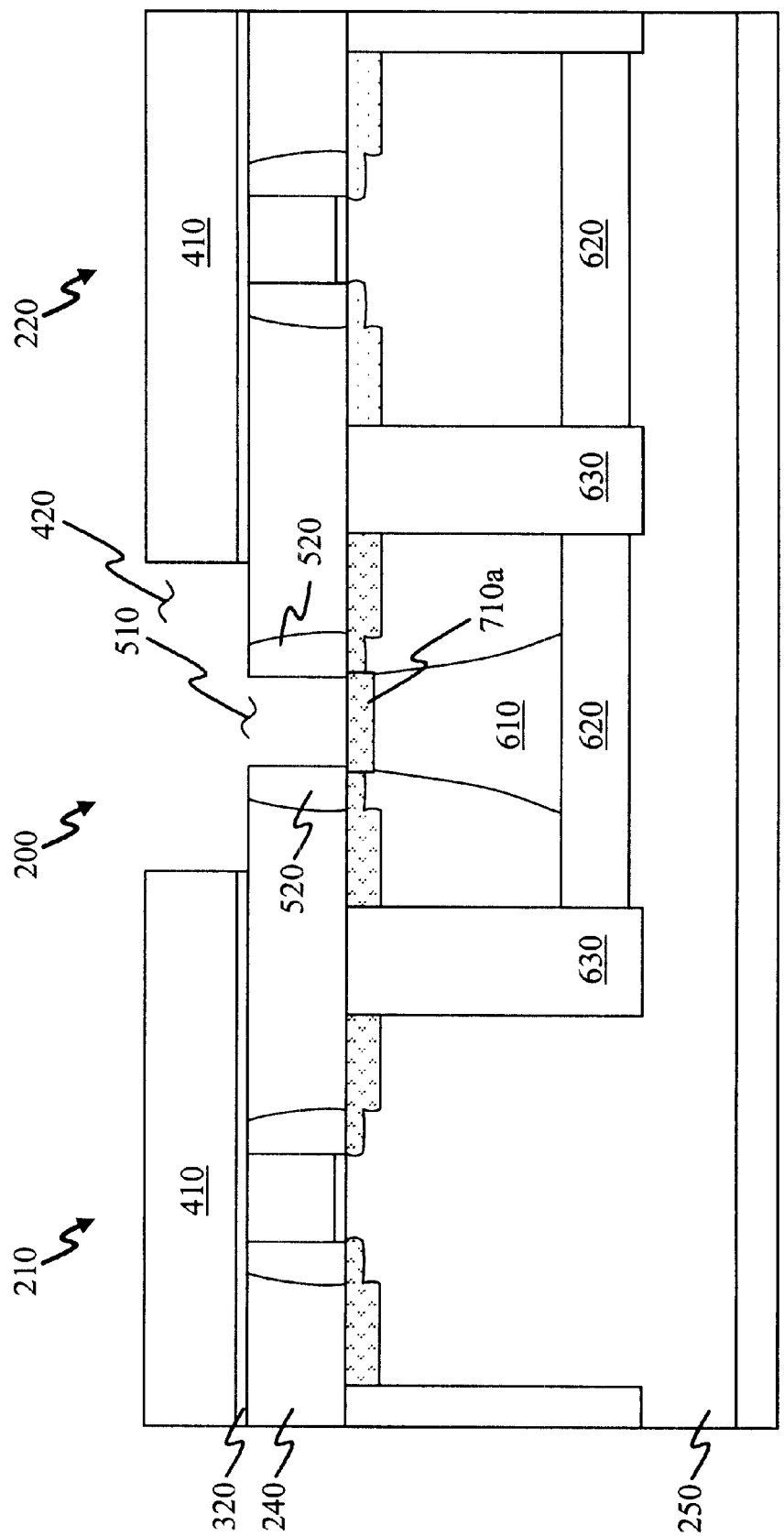
FIG. 8 illustrates the partially completed bipolar transistor illustrated in FIG. 7A, after removal of a gate oxide layer.

Turning to FIG. 8, illustrated is the partially completed bipolar transistor 200 illustrated in FIG. 7A, after removal of the gate oxide layer 720. Similar to above, the gate oxide layer 720 may be removed using any known or hereafter discovered technique. After removing the gate oxide layer 720, the exposed surface of the substrate 250 may be cleaned, followed by an optional hydrofluoric (HF) bath designed to remove a native oxide that may be present. For example, in an exemplary embodiment the HF bath could remove about 1.0 nm of native oxide. Before removing the gate oxide layer 720, the photolithographic mask 410 should be removed, using conventional processes.

Figure 9:
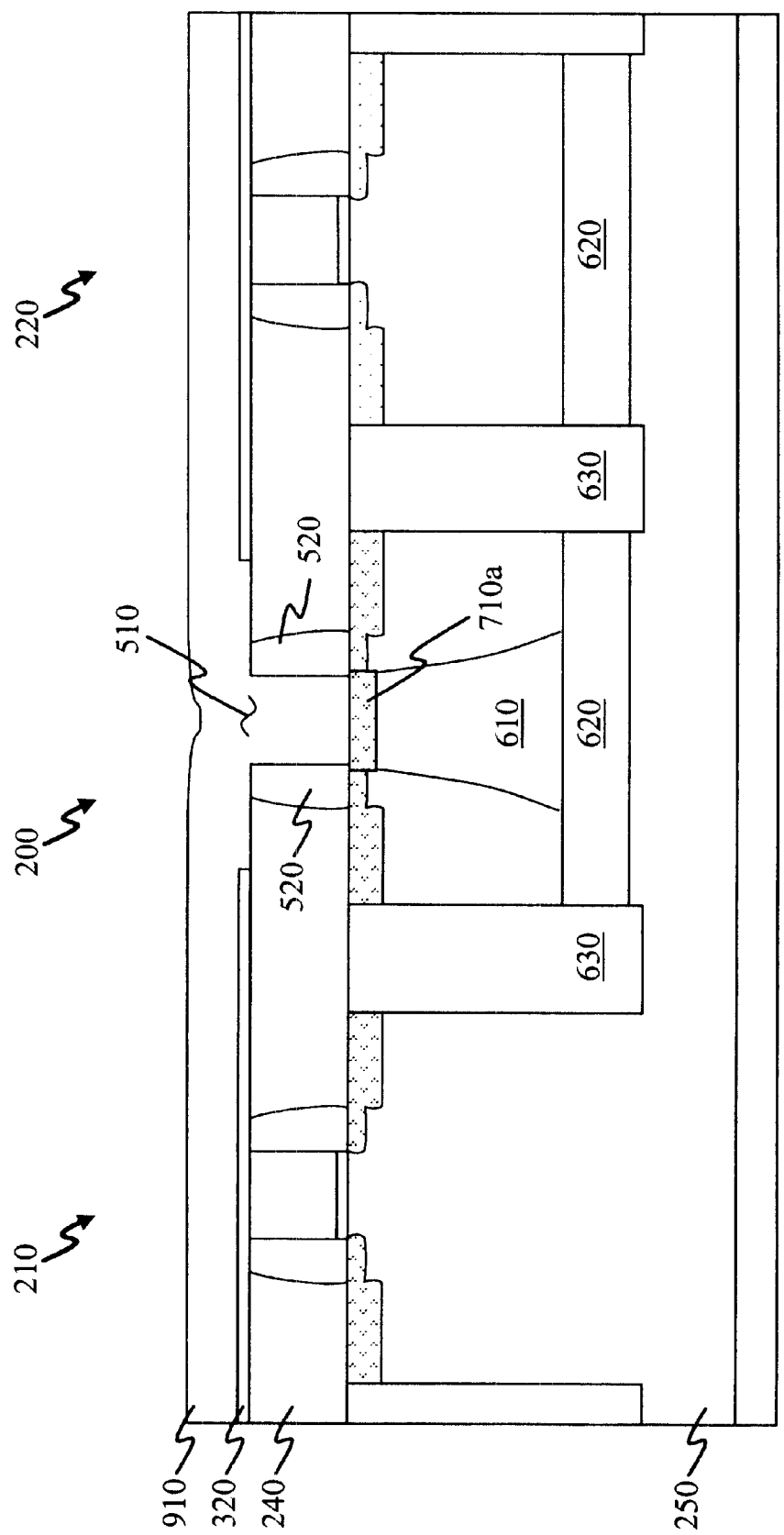
FIG. 9 illustrates the partially completed bipolar transistor illustrated in FIG. 8, after formation of a blanket emitter layer over a surface thereof.

Turning to FIG. 9, illustrated is the partially completed bipolar transistor 200 illustrated in FIG. 8, after formation of an emitter layer 910. In an exemplary embodiment the emitter layer 910 is comprised of poly-silicon. As illustrated, the blanket emitter layer 910 is also located within the opening 510 and in contact with the intrinsic base region 710a.

After formation of the emitter layer 910, the emitter layer 910 may be implanted with the first dopant. In this particular embodiment the emitter layer 910 is implanted with the first dopant to a maximum first dopant concentration (e.g., 1E21 atoms/cm$^3$). However, one skilled in the art understands that other dopant concentrations may be used, including a dopant concentration ranging from about 1E19 atoms/cm$^3$ to about 1E21 atoms/cm$^3$. If the partially completed bipolar transistor 200 is to be an NPN bipolar transistor, then the first dopant should be an N-type dopant and the second dopant should be a P-type dopant. However, if the partially completed bipolar transistor 200 is to be a PNP bipolar transistor, the first dopant should be a P-type dopant and the second dopant should be an N-type dopant. Examples of N-type and P-type dopants include arsenic and boron, respectively.

Figure 10:
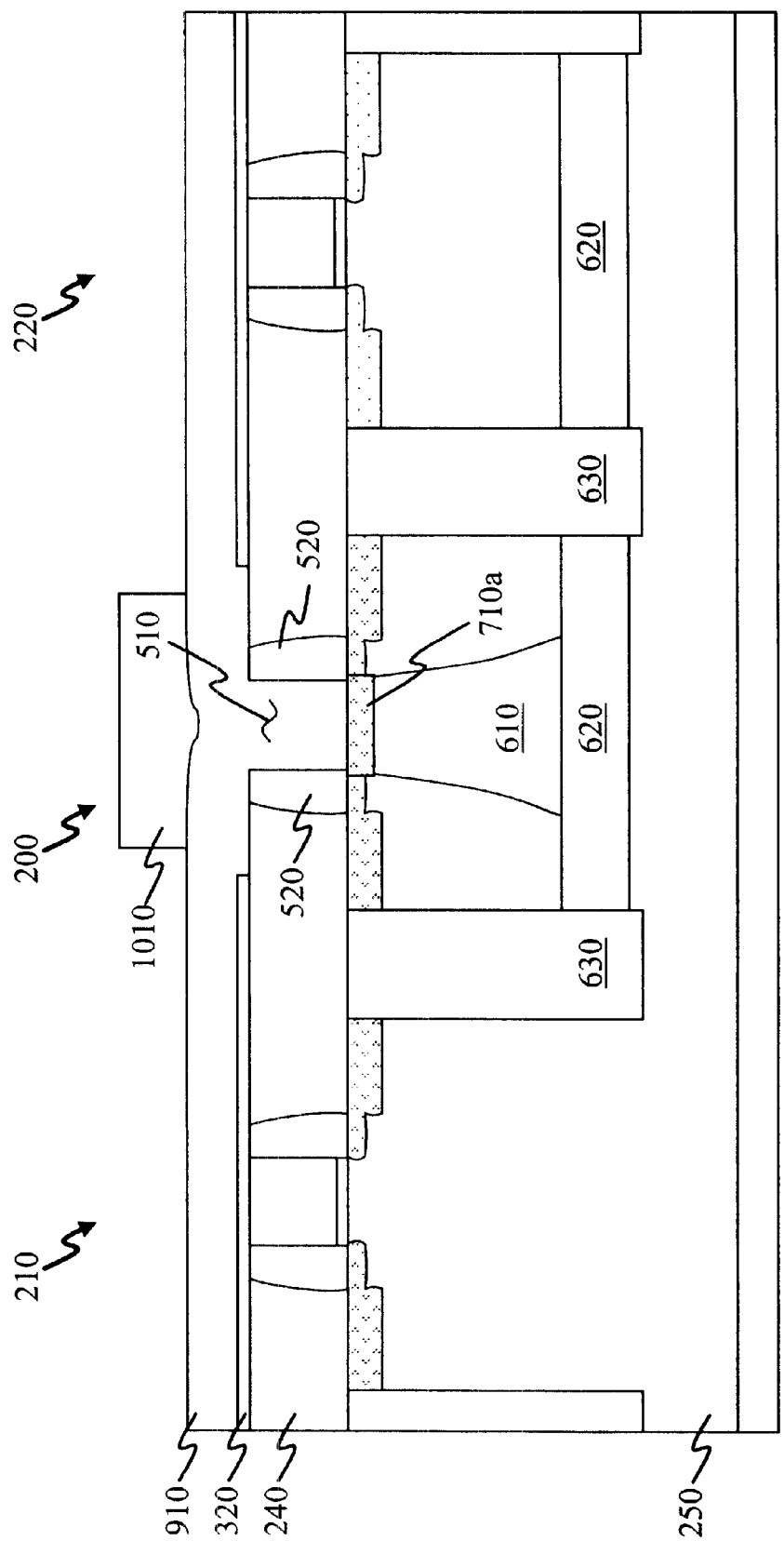
FIG. 10 illustrates the formation of a photolithographic mask, protecting a portion of the partially completed bipolar transistor.

Turning now to FIG. 10, illustrated is the conventional formation and patterning of a photolithographic mask 1010, protecting a portion of the partially completed bipolar transistor 200. Similar to the photolithographic mask 410 manufactured in FIG. 4, the photolithographic mask 1010 is a non-critical mask. Nonetheless, a width of the mask 1010 should be similar to a width desired for contacting an emitter (FIG. 11), which helps to avoid additional parasitic capacitance.

Figure 11:
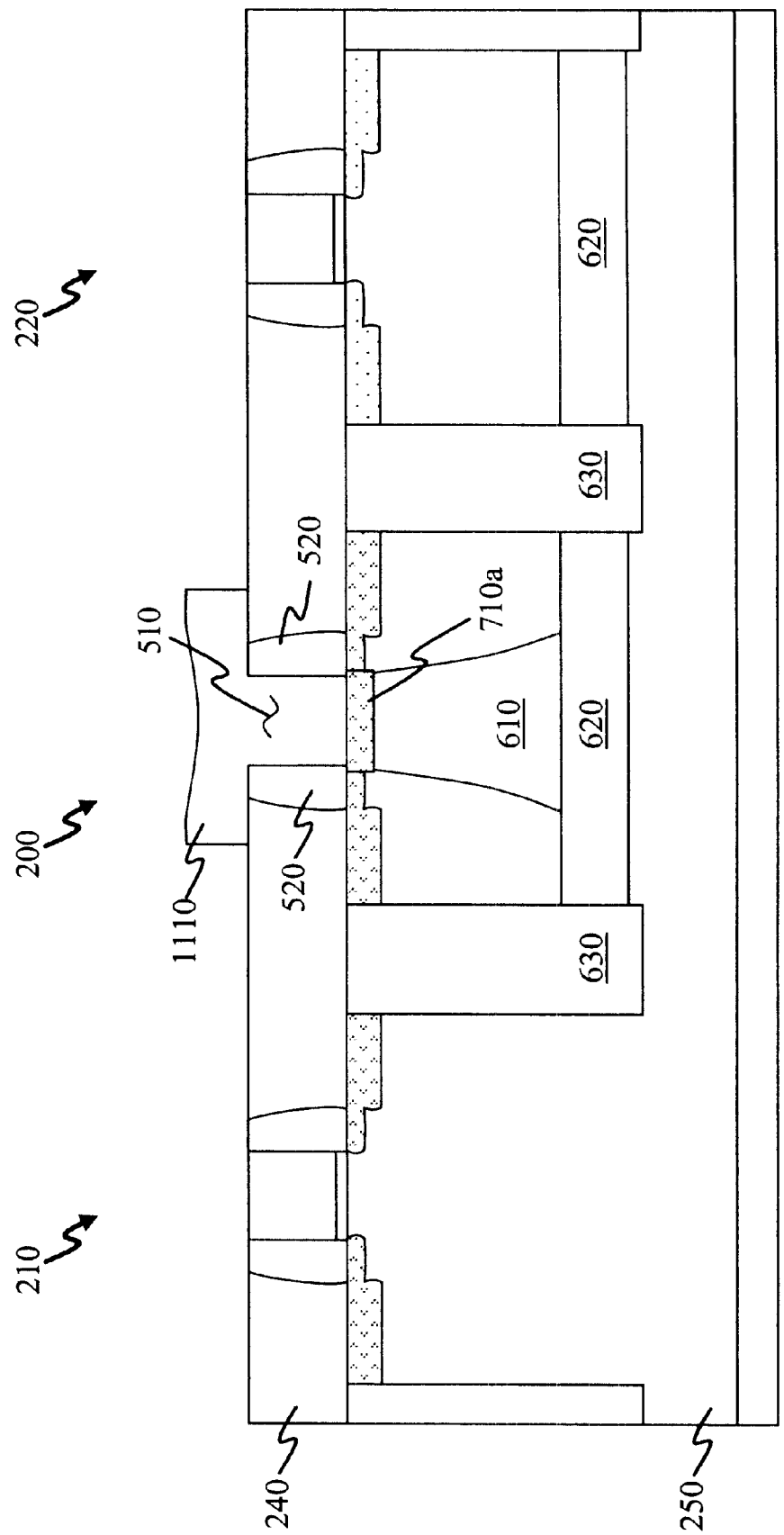
FIG. 11 illustrates the partially completed bipolar transistor illustrated in FIG. 10, after the unprotected portions are subjected to a conventional etch.

Turning to FIG. 11, illustrated is the partially completed bipolar transistor 200 illustrated in FIG. 10, after the unmasked portions are subjected to a conventional etch, producing an emitter 1110. As illustrated, the emitter 1110 may be formed within the opening 510 and contacting the intrinsic base region 710, but overlapping outside the emitter stripe, which helps to facilitate emitter contact formation. After the unmasked parts have been etched, the photolithographic mask 1010 may be conventionally removed. After removal of the photolithographic mask 1010, a conventional rapid thermal anneal (e.g., a temperature ranging from about 800° C. to about 1000° C. for about 5 seconds) may be used to activate any of the implants, resulting in the completed bipolar transistor 100 illustrated in FIG. 1.

The bipolar transistor 100 provides a low cost bipolar transistor, as compared to prior art bipolar transistors. Where the prior art bipolar transistors generally require from about 6 to about 9 masking steps for manufacture thereof, the bipolar transistor 100 may be manufactured from a conventional MOS transistor using only 3 additional masking steps. It should be noted that one masking step is required to remove the polysilicon from the MOS transistor and selectively implant that device, the second mask is required to pattern the emitter 1110 and a third mask is required to create a collector contact, although it might be possible to do without this mask in some applications, as the collector contact is similar to conventional CMOS tub-tie contact. This provides a substantial financial benefit over prior art devices.

Additionally, the bipolar transistor 100 is manufactured in such a way that it has a very low parasitic capacitance and a very straight forward processing sequence. Because the bipolar transistor 100 has less parasitic capacitance to charge during operation, the bipolar transistor 100 may be operated using less power, thus, resulting in a substantially faster bipolar transistor. In one embodiment of the invention, the bipolar transistor may operate as speeds up to and over 100 gigahertz.

Figure 12:
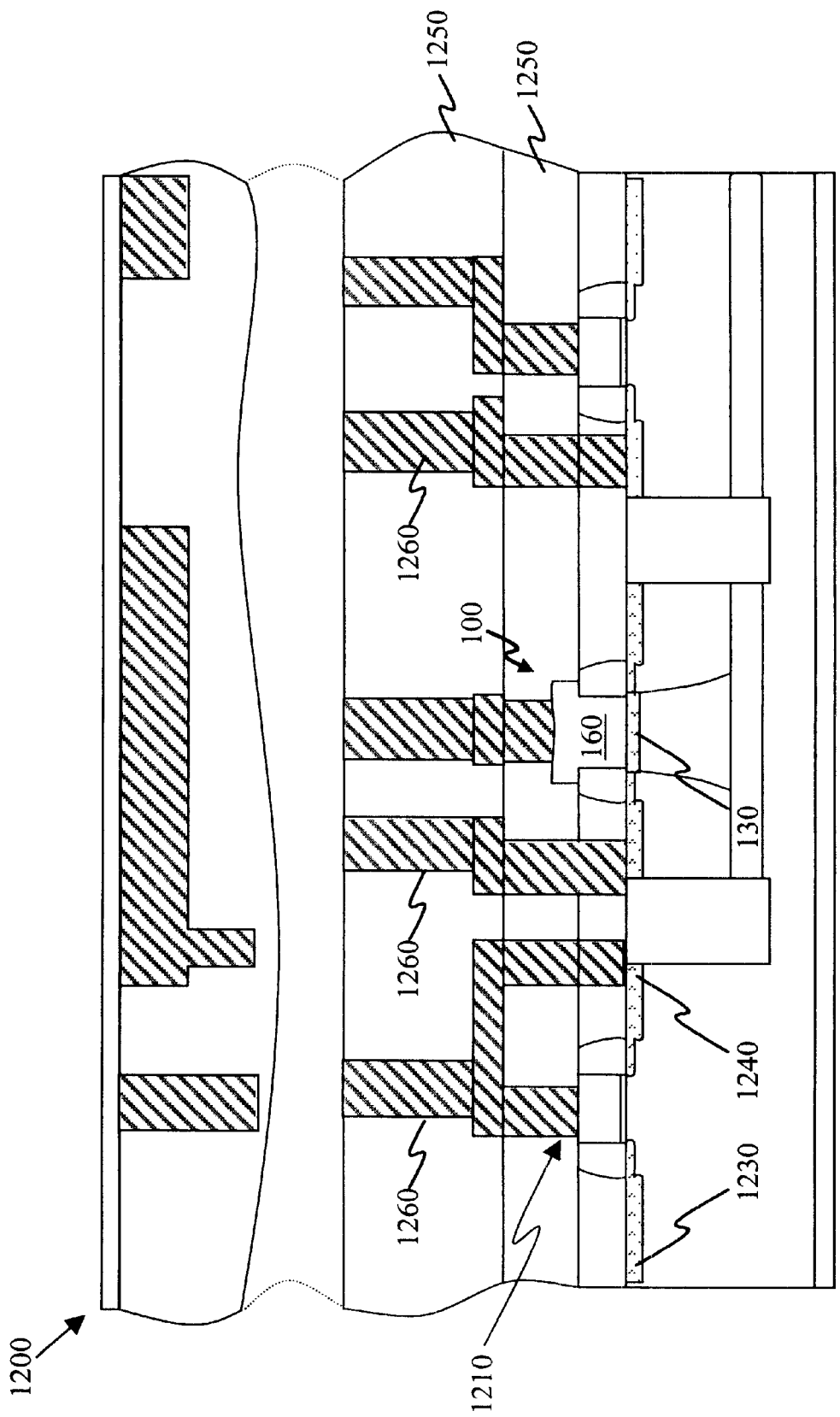
FIG. 12 illustrates a sectional view of a conventional integrated circuit (IC), incorporating the completed bipolar transistor illustrated in FIG. 1.

Referring finally to FIG. 12, illustrated is a sectional view of a conventional integrated circuit (IC) device 1200 incorporating the completed bipolar transistor 100 illustrated in FIG. 1. The IC device 1200 may include active devices, such as transistors used to form CMOS devices, Bipolar devices, or other types of active devices. The IC device 1200 may further include passive devices, such as inductors or resistors, or it may also include optical devices or optoelectronic devices. Those skilled in the art are familiar with these various types of devices and their manufacture. In the particular embodiment illustrated in FIG. 12, the IC device 1200 includes: the bipolar transistor 100, a MOS transistor 1210, a source region 1230, a drain region 1240, and dielectric layers 1250. Interconnect structures 1260, are located within the dielectric layer 1250, contacting the emitter 160, intrinsic base region 130 and transistors 1210, forming the operational integrated circuit 1200.

Although the present invention has been described in detail, those skilled in the art should understand that they can make various changes, substitutions and alterations herein without departing from the spirit and scope of the invention in its broadest form.

What is claimed is:

1. A method of manufacturing a bipolar transistor, comprising:
   removing a gate electrode located over a substrate, thereby forming an opening;
   forming a collector in the substrate by implanting a first dopant through the opening;
   creating an intrinsic base region contacting the collector and in the opening; and
   constructing an emitter contacting the intrinsic base region and in the opening.

2. The method as recited in claim 1 wherein removing a gate electrode includes removing a gate electrode located between gate sidewall spacers.

3. The method as recited in claim 1 wherein creating an intrinsic base region includes creating an intrinsic base region in the collector by implanting a second dopant through the opening.

4. The method as recited in claim 1 wherein creating an intrinsic base region includes growing an intrinsic base region on the collector through the opening.

5. The method as recited in claim 4 wherein growing an intrinsic base region on the collector includes growing an epitaxial silicon germanium base on the collector.

6. The method as recited in claim 1 wherein constructing an emitter contacting the intrinsic base region and in the opening includes depositing poly-silicon in the opening, implanting the poly-silicon with the first dopant and patterning the poly-silicon to form the emitter.

7. The method as recited in claim 1 wherein the first dopant is an N-type dopant and the second dopant is a P-type dopant.

8. A method of manufacturing an integrated circuit, comprising:
   fabricating bipolar transistors on a substrate, including:
      removing a gate electrode located over a substrate, thereby forming an opening;
      forming a collector in the substrate by implanting a first dopant through the opening;
      creating an intrinsic base region contacting the collector and in the opening; and
      constructing an emitter contacting the intrinsic base region and in the opening; and
   connecting the bipolar transistors to form an operative integrated circuit.

9. The method as recited in claim 8 wherein removing a gate electrode includes removing a gate electrode located between gate sidewall spacers.

10. The method as recited in claim 8 wherein creating an intrinsic base region includes creating an intrinsic base region in the collector by implanting a second dopant through the opening.

11. The method as recited in claim 8 wherein creating an intrinsic base region includes growing an intrinsic base region on the collector through the opening.

12. The method as recited in claim 11 wherein growing an intrinsic base region on the collector includes growing an epitaxial silicon germanium base on the collector.

13. The method as recited in claim 8 wherein constructing an emitter contacting the intrinsic base region and in the opening includes depositing poly-silicon in the opening, implanting the poly-silicon with the first dopant and patterning the poly-silicon to form the emitter.

14. The method as recited in claim 8 wherein the first dopant is an N-type dopant and the second dopant is a P-type dopant.

15. A semiconductor device, comprising:
   a bipolar transistor, including;
      a collector located in a substrate;
      an intrinsic base region located in the collector;
      source/drain regions contacting the intrinsic base region and located outside of the collector; and
      an emitter located on the substrate and over the intrinsic base region.

16. The semiconductor device as recited in claim 15 wherein the source/drain regions form a part of the intrinsic base region.

17. The semiconductor device as recited in claim 16 wherein at least one of the source/drain regions is an intrinsic base region contact.

18. The semiconductor device as recited in claim 15 wherein the collector and the emitter include a first dopant and the intrinsic base region includes a second dopant.

19. The semiconductor device as recited in claim 18 wherein the first dopant is an N-type dopant and the second dopant is a P-type dopant.

20. The semiconductor device as recited in claim 18 wherein the collector has a concentration of the first dopant ranging from about 1E16 atoms/cm$^3$ to about 1E17 atoms/ cm³, the intrinsic base region has a concentration of the second dopant ranging from about 1E19 atoms/cm³ to about 1E20 atoms/cm³, and the emitter has a concentration of the first dopant ranging from about 1E20 atoms/cm³ to about 1E21 atoms/cm³.

21. The semiconductor device as recited in claim 15 further including a complementary metal oxide semiconductor device having source/drain regions located adjacent the bipolar transistor, wherein a concentration and type of a dopant in the source/drain regions of the complementary metal oxide semiconductor device is substantially the same as a concentration and type of a dopant in the source/drain regions of the bipolar transistor.

22. A method of manufacturing a bipolar transistor, comprising:

producing an opening in a dielectric layer located over a substrate;

forming a collector in the substrate by implanting a first dopant through the opening;

growing an intrinsic base region on the collector through the opening; and constructing an emitter contacting the intrinsic base region and in the opening.

23. A method of manufacturing an integrated circuit, comprising:

fabricating bipolar transistors on a substrate, including:

producing an opening in a dielectric layer located over a substrate;

forming a collector in the substrate by implanting a first dopant through the opening;

growing an intrinsic base region on the collector through the opening; and constructing an emitter contacting the intrinsic base region and in the opening; and connecting the bipolar transistors to form an operative integrated circuit.

\* \* \* \* \*